(12) United States Patent
Gassner

(10) Patent No.: US 10,575,426 B2
(45) Date of Patent: Feb. 25, 2020

(54) ELECTRIC APPLIANCE AND HANGER FOR THE SAME

(71) Applicant: LIMOSS (SHENZHEN) CO., LTD., Bao'an District, Shenzhen (CN)

(72) Inventor: Christian Gassner, Shenzhen (CN)

(73) Assignee: LIMOSS (SHENZHEN) CO., LTD., Shenzhen (CN)

( * ) Notice: Subject to any disclaimer, the term of this patent is extended or adjusted under 35 U.S.C. 154(b) by 60 days.

(21) Appl. No.: 16/104,994

(22) Filed: Aug. 20, 2018

(65) Prior Publication Data

US 2019/0059169 A1  Feb. 21, 2019

(30) Foreign Application Priority Data

Aug. 21, 2017 (CN) .................... 2017 2 1052561 U

(51) Int. Cl.
*H05K 7/12* (2006.01)
*H05K 5/02* (2006.01)
*H05K 5/00* (2006.01)

(52) U.S. Cl.
CPC ............. *H05K 7/12* (2013.01); *H05K 5/0204* (2013.01); *H05K 5/0086* (2013.01)

(58) Field of Classification Search
CPC ...... H05K 5/0204; H05K 5/0217; H05K 7/12; H05K 7/1489; H05K 7/1474; H05K 5/00; H05K 5/02; F16M 13/02
See application file for complete search history.

(56) References Cited

U.S. PATENT DOCUMENTS

| | | | | |
|---|---|---|---|---|
| 5,483,437 A | * | 1/1996 | Tang | G06F 1/1616 320/111 |
| 8,113,598 B1 | * | 2/2012 | Cotilletta | F16M 11/041 312/7.1 |
| 2010/0139950 A1 | * | 6/2010 | Chen | H01R 13/72 174/135 |
| 2011/0121776 A1 | * | 5/2011 | Lev | G06F 1/1632 320/107 |
| 2012/0085872 A1 | * | 4/2012 | Santos | F16M 13/022 248/65 |
| 2016/0330853 A1 | * | 11/2016 | Wu | H05K 7/02 |

* cited by examiner

*Primary Examiner* — Jinhee J Lee
*Assistant Examiner* — Ingrid D Wright
(74) *Attorney, Agent, or Firm* — Westman, Champlin & Koehler, P.A.

(57) ABSTRACT

A hanger for holding a power adapter, wherein the hanger comprising a hanging plate and two first side plates and a second side plate extending from the three side edges of the hanging plate in the same direction, the two first side plates are oppositely disposed, and the two first side plates, the second side plate and the hanging plate collectively enclose an accommodating space which is open at an end surface of the hanger to form an opening; the free edges of the two first side plates are respectively connected with a baffle, and the two baffles are extended toward each other; a groove is formed between the baffle and the hanging plate for the power adapter sliding in; the first side plate is provided with an elastic buckle in the groove for buckling with the power adapter. Which is safe to use and has a long service life.

20 Claims, 6 Drawing Sheets

ELECTRIC APPLIANCE AND HANGER FOR THE SAME

CROSS-REFERENCE(S) TO RELATED APPLICATION(S)

This application claims the priority of Chinese patent application no. 2017210525611, filed on Aug. 21, 2017, the entire contents of which are incorporated herein by reference.

TECHNICAL FIELD

The present application relates to the field of electronic device, and more particularly to an electric appliance and its hanger.

BACKGROUND

The power adapter is a power supply conversion device for small portable electronic devices and electronic appliances. It is widely used in security cameras, set-top boxes, routers, light bars, liquid crystal displays, laptops, massage chairs, electric beds, medical beds and other electronic devices.

When using these electronic devices, the power adapter is connected between the mains power interface and the electronic device. After this connection, the power adapter is often placed on the ground or on the table near the electronic device at will. The power adapter placed in this way not only makes the working environment messy, but also reduces the service life of the power adapter because the ground is wet or accidentally hit, kicked, etc.; if there are other electronic devices or peripheral electronic circuits are more complicated beside the electronic device, and there is a risk of fire during the use of the power adapter.

SUMMARY

Embodiments disclosed in the present application provide an electric appliance and its hanger that can solve the problem that the power adapter in the prior art cannot be fixed, is easily damaged by an external force, and affects the service life.

The present application can be implemented as follows, a hanger for holding a power adapter, the hanger comprising a hanging plate and two first side plates and one second side plate respectively extending from the three side edges of the hanging plate in the same direction, the two first side plates being oppositely disposed, and the two first side plates, the second side plate and the hanging plate collectively enclose an accommodating space which is open at an end surface of the hanger to form an opening; the free edges of the two first side plates are respectively connected with a baffle, and the two baffles are extended toward each other; a groove is formed between the baffle and the hanging plate for the power adapter sliding in; the first side plate is provided with an elastic buckle in the groove for buckling with the power adapter.

Further, the elastic buckle is disposed on a position close to the third side plate, and the elastic buckle includes an elastic arm connected to the first side plate at one end and a free end formed on the elastic arm.

Further, a free end of the elastic arm extends toward the inside of the groove to form a block, the block has a first guiding surface, and the first guiding surface is inclined toward the second side plate.

Further, the baffle is formed with a second guiding surface at the opening, and the groove is outwardly expanded at one end of the second guiding surface.

Further, the electronic device includes a power adapter and the hanger, and the power adapter is mounted on the hanger.

Further, the power adapter is recessed in the accommodating space of the hanger, and a side of the power adapter is slid and limited into the groove and is buckled at the elastic buckle, an end of the power adapter abuts against the second side plate.

Further, the side of the power adapter is formed with a slot and a limit plate, and the limit plate is slidably disposed and limited in the groove, and the baffle is slidably disposed and limited in the slot.

Further, the limit plate is provided with a notch, and one end of the elastic buckle is engaged with the notch.

Further, a side of the limit plate adjacent to the notch is formed with a third guiding surface, and the third guiding surface is inclined toward a direction in which the limit plate slides into the groove.

Further, the electric appliance is selected from a group consisting of a security camera, a set top box, a router, a light bar, a liquid crystal display, a laptop, a massage chair, an electric bed and a medical bed.

Compare to the prior art, the technical effect of the present application is: firstly, the hanger is fixed on the wall or a position that is not easily impacted by an external force, and then the power adapter to be used is inserted into the accommodating space along the groove of the hanger, until the elastic buckle arranged on the first side plate is snap-fitted to the power adapter. At this time, the power adapter and the hanger are fixed together at a predetermined position. In this way, not only the work site environment is clean and tidy, but also the impact of the external force on the power adapter is avoided, which not only makes the power adapter safe to use, but also has a long service life.

The present summary is provided only by way of example, and not limitation. Other aspects of the present invention will be appreciated in view of the entirety of the present disclosure, including the entire text, claims and accompanying figures.

Figure 1:
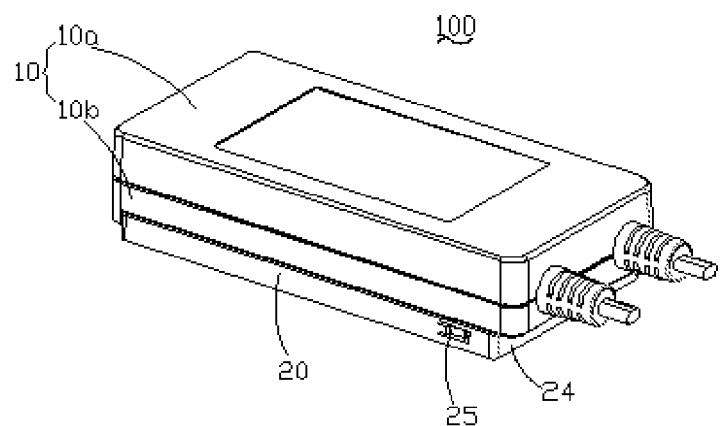
FIG. 1 is a schematic structural view of a power adapter and a hanging plate provided by an embodiment of the present application.

The relationship between the reference numerals and the corresponding components in the drawing are as follow:
100 electric appliance, 24 second side plate;
10 power adapter, 25 elastic buckle;
20 hanger, 231 second guiding surface;
211 reinforcing rib, 27 threaded hole;
21 hanging plate, 28 accommodating space;
22 first side plate, 26 groove;
23 baffle, 281 opening;
11 limit plate, 12 slot;
111 first guiding surface, 112 notch;
251 elastic arm, 252 block;
2521 third guiding surface.

While the above-identified figures set forth one or more embodiments of the present invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features, steps and/or components not specifically shown in the drawings.

DETAILED DESCRIPTION OF THE EMBODIMENTS

The embodiments of the present application are described in detail below, and the examples of the embodiments are illustrated in the drawings, wherein the same or similar reference numerals are used to refer to the same or similar components or components having the same or similar functions. The embodiments described below with reference to the drawings are intended to be illustrative of the present application and are not to be construed as limiting.

In the description of the present application, it is to be understood that the orientations or positional relationships indicated by the terms "thickness", "upper", "lower", "vertical", "parallel", "bottom", "angle", etc. are based on the orientation or positional relationship shown in the drawings is merely for the convenience of the description of the present application and the simplified description, and is not intended to indicate or imply that the device or component referred to has a specific orientation, is constructed and operated in a specific orientation, and thus cannot be understood to limit the present application.

In the present application, the terms "installation", "connection" and the like should be understood broadly, and may be, for example, a fixed connection, a detachable connection, or an integral; may also be a mechanical connection, an electrical connection; it may also be directly connected or indirectly connected through an intermediate medium, and may be an internal connection of two elements or an interaction relationship of two elements.

Figure 2:
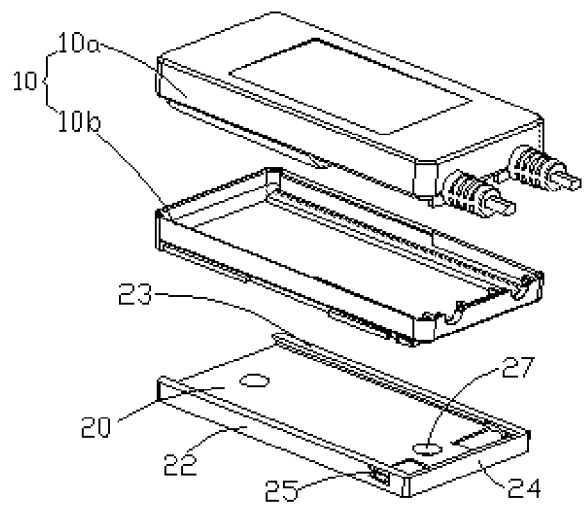
FIG. 2 is an exploded view of the top view of FIG. 1.
Figure 3:
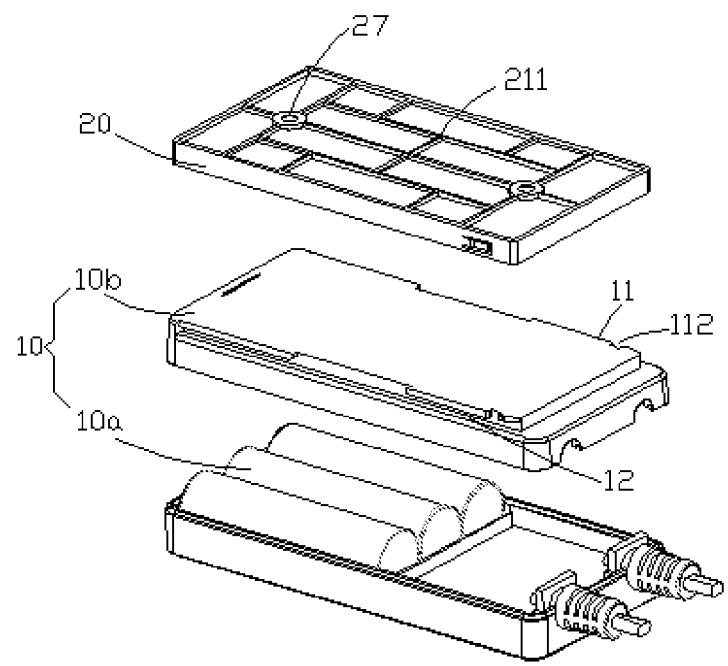
FIG. 3 is an exploded view of the bottom view of FIG. 1.

Please refer to FIG. 1 to FIG. 3, the electric appliance 100 provided in the embodiment includes a power adapter 10 and a hanger 20 for holding the power adapter 10. The power adapter 10 includes an upper housing 10a and a lower housing 10b that is matched with the upper housing 10a.

Figure 4:
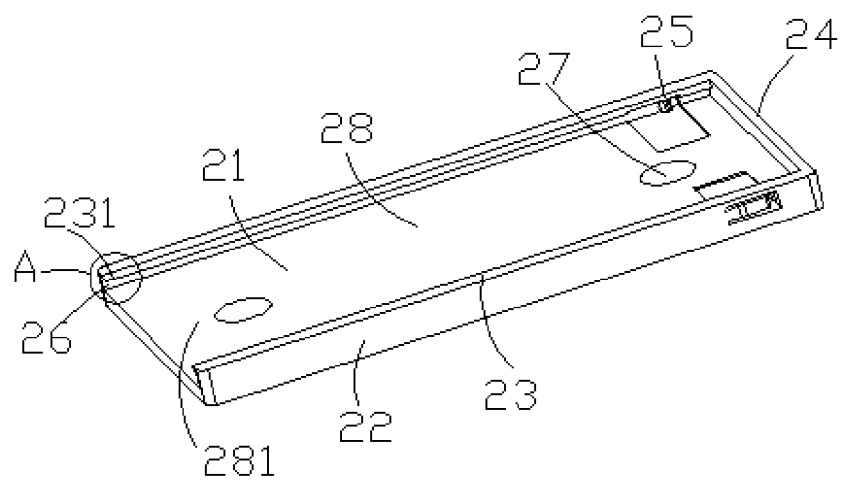
FIG. 4 is a schematic structural view of the power adapter of FIG. 1.
Figure 5:
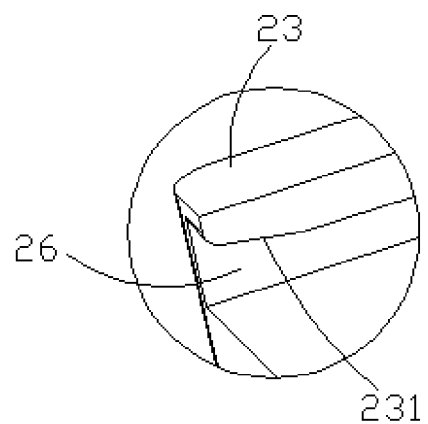
FIG. 5 is a partially enlarged schematic structure view showing a portion A of FIG. 4.
Figure 6:
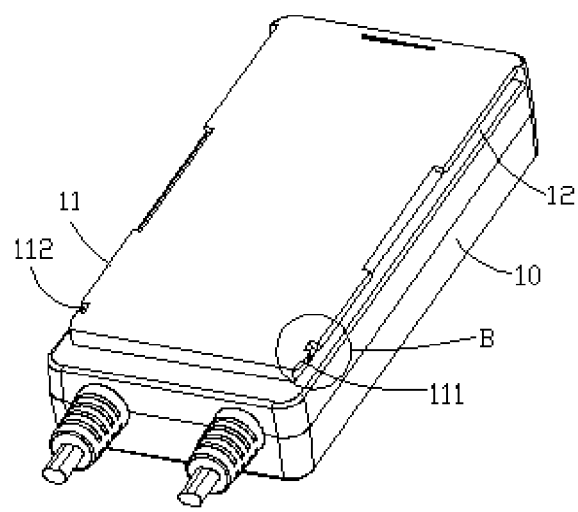
FIG. 6 is a schematic view of the hanging plate of FIG. 1.
Figure 7:
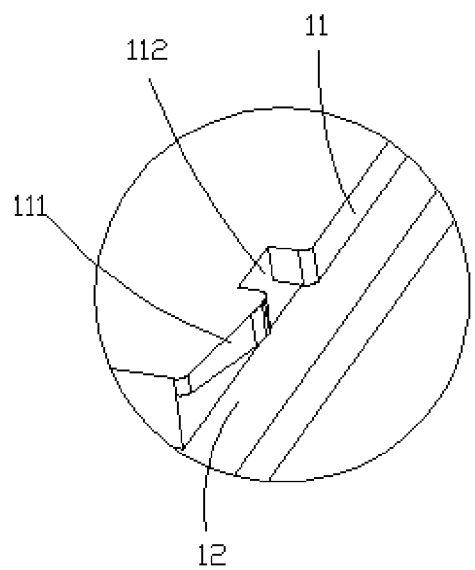
FIG. 7 is a partially enlarged schematic view showing a portion B of FIG. 6.
Figure 8:
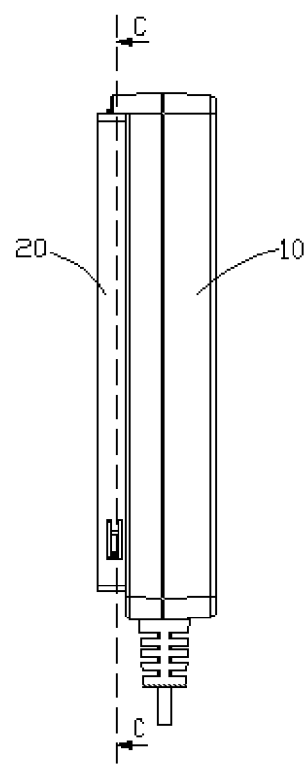
FIG. 8 is a right side view of the power adapter of FIG. 6.
Figure 9:
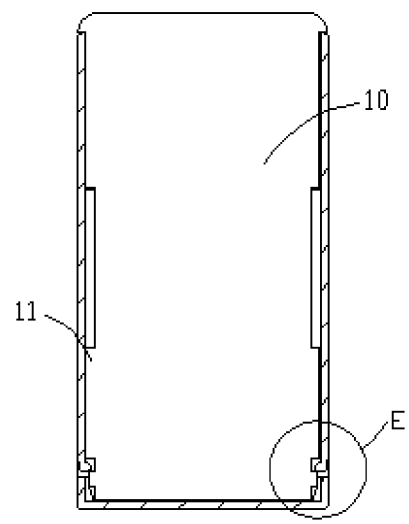
FIG. 9 is a cross-sectional view taken along line C-C of FIG. 8.

Please refer to FIG. 4 to FIG. 6 together, the hanger 20 includes a hanging plate 21, three side edges of the hanging plate 21 extending towards the same direction with two first side plates 22 and one second side plate 24. The two first side plates 22 are disposed in parallel with each other, and the second side plate 24 is located between the two opposite first side plates 22. The two first side plates 22, the second side plates 24, and the hanging plates 21 are collectively enclosed an accommodating space 28. The accommodating space 28 is open at one end of the hanging plate 21 to form an opening 281. Free sides of the two first side plates 22 are connected with a baffle 23 respectively, and grooves 26 are formed between the two baffles 23 and the hanging plate 21, and the power adapter 10 can slide into the accommodating space 28 along the groove 26.

The first side plate 22 is provided with an elastic buckle 25 which is located in the groove 26 and disposed at a position close to the second side plate 22. The elastic buckle 25 includes an elastic arm 251, one end of the elastic arm 251 is connected with the first side plate 22, and another end of the elastic arm 251 is formed a free end. The free end of the elastic arm 251 extends into the groove 26 and forms with a block 252. The block 252 has a first guiding surface 2521, and the first guiding surface 2521 is inclined toward the second side plate 24. The block 252 is located between the second side plate 24 and the connecting end of the elastic arm 251.

A second guiding surface 231 is formed at an end of the baffle 23 at the opening 281, and the groove 26 is outwardly expanded at the second guiding surface 231.

Please refer to FIG. 6 to FIG. 9, both sides of the power adapter 10 are formed with a limit plate 11 and a slot 12. The shape of the limit plate 11 is matched with the groove 26, and the shape of the slot 12 is matched with the baffle 23.

Figure 10:
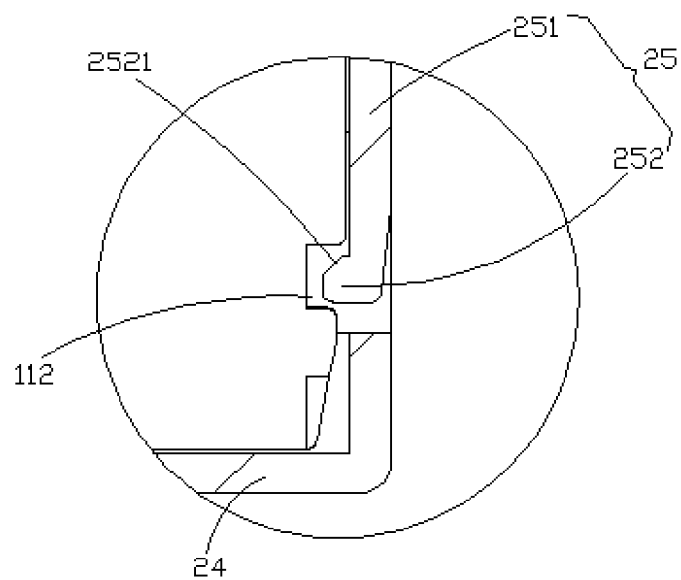
FIG. 10 is a partially enlarged schematic view showing a portion of E of FIG. 9.
Figure 11:
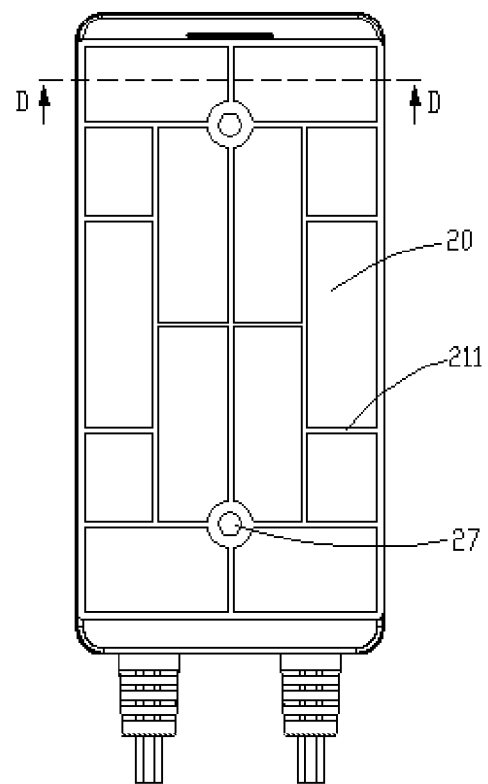
FIG. 11 is a bottom view of FIG. 1.
Figure 12:
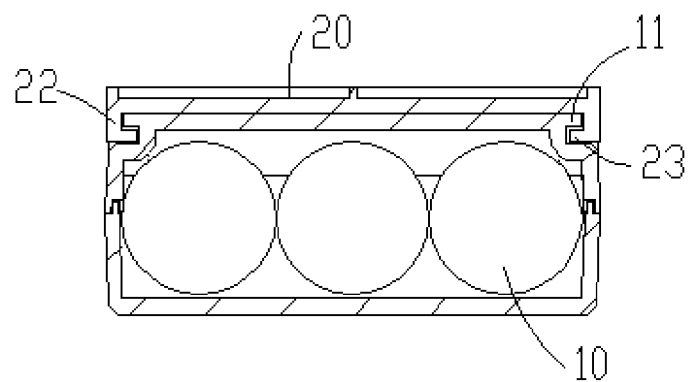
FIG. 12 is a cross-sectional view taken along line D-D of FIG. 11.

Please refer to FIG. 10 to FIG. 12, the limit plate 11 on the side of the power adapter 10 matches with the groove 26. A third guiding surface 111 is formed at one end of the limit plate 11 that first contacts the groove 26 along the direction in which the power adapter 10 slides into the accommodating space 28. The third guiding surface 111 is matched with the first guiding surface 2521 and the second guiding surface 231. The limit plate 11 is further provided with a notch 112, and the notch 112 is located at one end of the limit plate 11 on which the third guiding surface 111 is formed. The third guiding surface 111 is inclined toward the notch 112. The limit plate 11 slides along the groove 26, and the slot 12 slides along the baffle 23, and the sliding direction faces the second side plate 22. The elastic arm 251 of the elastic buckle 25 expands in a direction away from the groove 26. Under the guidance of the first guiding surface 2521, one end portion of the power adapter 10 is abutted with the second side plate 22, and the elastic arm 251 of the elastic buckle 25 is reset, and the block 252 is snap-fitted in the notch 112. The limit plate 11 is limited to the groove 26, and the baffle 23 is limited to the slot 12, the power adapter 10 is limited to the accommodating space 28.

A threaded hole 27 is formed in a surface of the hanging plate 21 in one side of the accommodating space 28, and a plurality of reinforcing ribs 211 are disposed on the surface of the opposite side thereof.

A plurality of reinforcing ribs 211 are vertically staggered to each other to enhance the strength of the hanging plate 21. The threaded hole 27 is located between the two first side plates 22 and penetrates both side surfaces of the hanging plate 21. Preferably, the number of threaded holes 27 is two. In other embodiments, the number of threaded holes 27 can be set according to the fixing needs of the hanging plate 21.

The hangers 20 can be vertically fixed to the wall by two threaded holes 27, transversally fixed to the horizontal table, and the places are not easily impacted by external forces. The power adapter 10 is slid into the accommodating space 28 of the hanger 20 along the groove 26 of the hanger 20, and is connected to the notch 112 through the elastic buckle 25, and the power adapter 10 is limited to the hanger 20. Thus, the power adapter 10 is fixed at a predetermined position. Therefore, the work site environment is clean and tidy, and the impact of the external force on the power adapter 10 is avoided, so that the power adapter 10 is safe to use and has a long service life.

The electrical device 100 can be selected from a group consisting of a security camera, a set top box, a router, a light bar, a liquid crystal display, a laptop, a massage chair, an electric bed and a medical bed.

The aforementioned embodiments are only preferred embodiments of the present application, and are not intended to limit the present application. Any modification, equivalent replacement, improvement, and so on, which are made within the spirit and the principle of the present application, should be included in the scope of the present application. Therefore, the scope of the present application is subject to the scope of the claims.

It's obvious that the aforementioned embodiments are only preferred embodiments of the present application, and are not intended to limit the present application. Any modification, equivalent replacement, improvement, and so on, which are made within the spirit and the principle of the present application, should be comprised in the scope of the present application.

What is claimed is:

1. A hanger for holding a power adapter, the hanger comprising a hanging plate, and two first side plates and one second side plate respectively extending from three side edges of the hanging plate towards the same direction, with the two first side plates being oppositely disposed, wherein the two first side plates, the second side plate and the hanging plate collectively enclose an accommodating space which is open at an end surface of the hanger to form an opening; free edges of the two first side plates are respectively connected with a baffle, with the baffles being extended toward each other; a groove is formed between the baffle and the hanging plate for the power adapter sliding in; and the first side plate is provided with an elastic buckle in the groove for buckling with the power adapter.

2. The hanger of claim 1, wherein the elastic buckle is disposed on a position close to the second side plate, and the elastic buckle includes an elastic arm connected to one of the first side plates at an end, and a free end formed on the elastic arm.

3. The hanger of claim 2, wherein a free end of the elastic arm extends toward the inside of the groove to form a block, the block has a first guiding surface, and the first guiding surface is inclined toward the second side plate.

4. The hanger of claim 3, wherein the baffle is formed with a second guiding surface at the opening, and the groove is outwardly expanded at one end of the second guiding surface.

5. An electric appliance comprising a power adapter and the hanger of claim 4, and the power adapter is mounted onto the hanger.

6. The electric appliance of claim 5, wherein the power adapter is recessed in the accommodating space of the hanger, and a side of the power adapter is slid and limited into the groove and is buckled at the elastic buckle, an end of the power adapter abuts against the second side plate.

7. An electric appliance comprising a power adapter and the hanger of claim 3, and the power adapter is mounted onto the hanger.

8. The electric appliance of claim 7, wherein the power adapter is recessed in the accommodating space of the hanger, and a side of the power adapter is slid and limited into the groove and is buckled at the elastic buckle, an end of the power adapter abuts against the second side plate.

9. An electric appliance comprising a power adapter and the hanger of claim 2, and the power adapter is mounted onto the hanger.

10. The electric appliance of claim 9, wherein the power adapter is recessed in the accommodating space of the hanger, and a side of the power adapter is slid and limited into the groove and is buckled at the elastic buckle, an end of the power adapter abuts against the second side plate.

11. An electric appliance comprising a power adapter and the hanger of claim 1, and the power adapter is mounted onto the hanger.

12. The electric appliance of claim 11, wherein the power adapter is recessed in the accommodating space of the hanger, and a side of the power adapter is slid and limited into the groove and is buckled at the elastic buckle, an end of the power adapter abuts against the second side plate.

13. The electric appliance of claim 12, wherein the side of the power adapter is formed with a slot and a limit plate, and the limit plate is slidably disposed in and being limited in the groove, and the baffle is slidably disposed and limited in the slot.

14. The electric appliance of claim 13, wherein the electric appliance is selected from a group consisting of a security camera, a set top box, a router, a light bar, a liquid crystal display, a laptop, a massage chair, an electric bed and a medical bed.

15. The electric appliance of claim 13, wherein the limit plate is provided with a notch, and one end of the elastic buckle is engaged with the notch.

16. The electric appliance of claim 15, wherein the electric appliance is selected from a group consisting of a security camera, a set top box, a router, a light bar, a liquid crystal display, a laptop, a massage chair, an electric bed and a medical bed.

17. The electric appliance of claim 15, wherein a side of the limit plate adjacent to the notch is formed with a third guiding surface, and the third guiding surface is inclined toward a direction in which the limit plate slides into the groove.

18. The electric appliance of claim 17, wherein the electric appliance is selected from a group consisting of a security camera, a set top box, a router, a light bar, a liquid crystal display, a laptop, a massage chair, an electric bed and a medical bed.

19. The electric appliance of claim 12, wherein the electric appliance is selected from a group consisting of a security camera, a set top box, a router, a light bar, a liquid crystal display, a laptop, a massage chair, an electric bed and a medical bed.

20. The electric appliance of claim 11, wherein the electric appliance is selected from a group consisting of a security camera, a set top box, a router, a light bar, a liquid crystal display, a laptop, a massage chair, an electric bed and a medical bed.

* * * * *